US012619144B2

(12) United States Patent
Youn et al.

(10) Patent No.: US 12,619,144 B2
(45) Date of Patent: May 5, 2026

(54) POSITIVE PHOTOSENSITIVE RESIN COMPOSITION

(71) Applicant: DONGJIN SEMICHEM CO., LTD., Incheon (KR)

(72) Inventors: Hyoc Min Youn, Hwaseong-si (KR); Tai Hoon Yeo, Hwaseong-si (KR); Gi Seon Lee, Hwaseong-si (KR); Bong Hee Kim, Hwaseong-si (KR); Dong Myung Kim, Hwaseong-si (KR)

(73) Assignee: DONGJIN SEMICHEM CO., LTD., Incheon (KR)

( * ) Notice: Subject to any disclaimer, the term of this patent is extended or adjusted under 35 U.S.C. 154(b) by 932 days.

(21) Appl. No.: 17/854,922

(22) Filed: Jun. 30, 2022

(65) Prior Publication Data

US 2022/0334478 A1 Oct. 20, 2022

Related U.S. Application Data

(63) Continuation of application No. PCT/KR2020/019343, filed on Dec. 29, 2020.

(30) Foreign Application Priority Data

Dec. 31, 2019 (KR) ........................ 10-2019-0179822
Dec. 29, 2020 (KR) ........................ 10-2020-0185639

(51) Int. Cl.
*G03F 7/023* (2006.01)
*G03F 7/037* (2006.01)
*G03F 7/039* (2006.01)
*H10K 59/124* (2023.01)

(52) U.S. Cl.
CPC ............ *G03F 7/0233* (2013.01); *G03F 7/037* (2013.01); *G03F 7/039* (2013.01); *H10K 59/124* (2023.02)

(58) Field of Classification Search
None
See application file for complete search history.

(56) References Cited

U.S. PATENT DOCUMENTS

| | | | | |
|---|---|---|---|---|
| 5,138,424 A * | 8/1992 | Moss | H01L 23/5329 257/E21.259 |
| 2018/0362763 A1* | 12/2018 | Miyazaki | H10K 85/621 |
| 2020/0363722 A1* | 11/2020 | Kandanarachchi | G03F 7/0226 |

FOREIGN PATENT DOCUMENTS

| | | | |
|---|---|---|---|
| CN | 1930522 | A | 3/2007 |
| CN | 109642028 | A | 4/2019 |
| JP | 61-67228 | A | 4/1986 |
| JP | 2000-119519 | A | 4/2000 |
| JP | 2005-043883 | A | 2/2005 |
| KR | 10-2005-0007135 | A | 1/2005 |
| KR | 10-0914064 | B1 | 8/2009 |
| KR | 10-2011-0018668 | A | 2/2011 |
| TW | 200947129 | A | 11/2009 |
| TW | 201134855 | A | 10/2011 |
| TW | 201841987 | A | 12/2018 |

OTHER PUBLICATIONS

McKean, D. R. et al., "Base-Catalyzed Photosensitive Polyimide," Polymers for Microelectronics, 1993, 417-27.
Thiruvasagam, P. et al., "Synthesis and characterization of polyimide & co-polyimides derived from diol monomers," Journal of Polymer Research, 2015, vol. 22.

* cited by examiner

*Primary Examiner* — Robert S Jones, Jr.
*Assistant Examiner* — Lily K Sloan
(74) *Attorney, Agent, or Firm* — United One Law Group LLC; Kongsik Kim; Jhongwoo Peck

(57) ABSTRACT

A positive photosensitive resin composition includes a polymer resin, a quinonediazide compound, and a solvent. The polymer resin includes (i) 5 to 95 wt. % of a polyimide precursor having a structural unit represented by Formula 1, ii) 5 to 95 wt. % of a polyimide precursor having a structural unit represented by Formula 2, and iii) 0 to 20 wt. % of a polyimide precursor having a structural unit represented by Formula 3. The quinonediazide compound is included in an amount of 5 to 50 parts by weight per 100 parts by weight of the polymer resin. The solvent is included in an amount of 100 to 2,000 parts by weight per 100 parts by weight of the polymer resin.

12 Claims, 1 Drawing Sheet

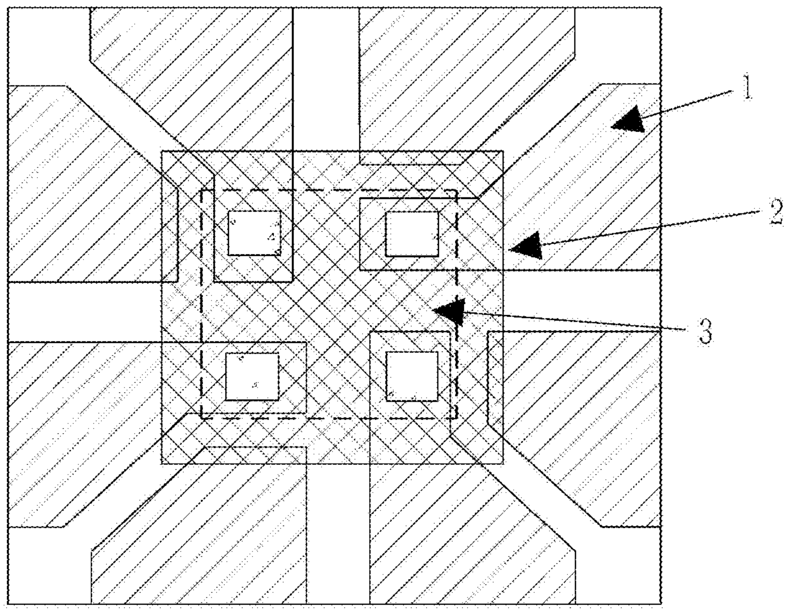
1
2
3

POSITIVE PHOTOSENSITIVE RESIN COMPOSITION

CROSS-REFERENCE TO RELATED APPLICATIONS

This application is a Continuation of International Application No. PCT/KR2020/019343, filed on Dec. 29, 2020, which claims priority to Korean Application No. 10-2019-0179822, filed on Dec. 31, 2019, and Korean Application No. 10-2020-0185639, filed on Dec. 29, 2020. The aforementioned applications are incorporated herein by reference in their entireties.

TECHNICAL FIELD

The present invention relates to a positive photosensitive resin composition, and more particularly, to a positive photosensitive resin composition used in a display device.

RELATED ART

In the recent market, organic light emitting diodes (OLEDs), especially active matrix OLED (AMOLED), are in the spotlight for several reasons among display devices.

Typically, an OLED device includes an organic insulating film, and a polyimide photosensitive resin composition is generally used to form the organic insulating film. Among polyimide precursors used in conventional polyimide photosensitive resin compositions, the technology of substituting alkyls for polyamic esters was used. However, the polyamic esters substituted with alkyls are difficult in solubility control and have low sensitivity. Therefore, measures for improvement of the polyamic esters were urgently requested.

SUMMARY

Accordingly, the objective of the present invention is to provide a positive photosensitive resin composition that can be easily controlled in solubility and which has significantly improved sensitivity.

In order to achieve the above objective, the present invention provides a positive photosensitive resin composition including: a polymer resin including i) 5 to 95 wt. % of a polyimide precursor having a structural unit represented by Formula (1), ii) 5 to 95 wt. % of a polyimide precursor having a structural unit represented by Formula (2), and iii) 0 to 20 wt. % of a polyimide precursor having a structural unit represented by Formula (3); 5 to 50 parts by weight of a quinonediazide compound per 100 parts by weight of the polymer resin; and 100 to 2,000 parts by weight of a solvent per 100 parts by weight of the polymer resin.

[Formula 1]

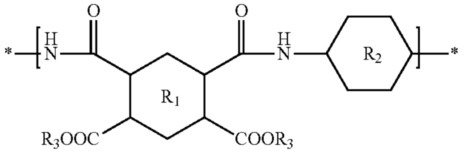

-continued

[Formula 2]

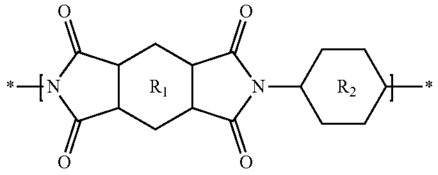

[Formula 3]

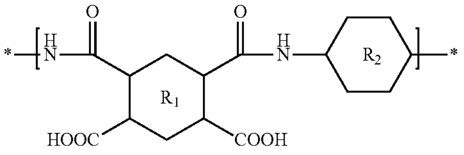

In Formulas 1 to 3, $R_1$ and $R_2$ are each independently an organic group having 5 to 30 carbon atoms. In the organic group, hydrogen may be substituted with a hydroxyl group (OH), methyl, or fluorine. The methylene group may be substituted with oxygen or nitrogen. $R_3$ is a substituent derived from epoxy.

The present invention also provides a display device including a driving circuit, a planarization layer, a first electrode, an insulating layer, a light emitting layer, and a second electrode on a substrate, in which at least one of the planarization layer and the insulating layer is formed from the positive photosensitive resin composition.

The positive photosensitive resin composition according to the present invention is easily controlled in solubility, improves sensitivity, chemical resistance, adhesion, etc., when forming a pattern of a display device such as OLED, and inhibits generation of scum and cracks.

BRIEF DESCRIPTION OF THE DRAWINGS

FIG. 1 is a view showing that a pattern film is formed on an indium tin oxide (ITO) substrate with a pattern formed thereon, and electroluminescent lighting (EL) is deposited, according to an embodiment of the present invention.

DETAILED DESCRIPTION

Hereinafter, the present invention will be described in detail.

In the present specification, "*" means a moiety connected to the same or different atom or chemical formula.

The positive photosensitive resin composition according to the present invention contains a polymer resin, a quinonediazide compound, and a solvent.

The polymer resin used in the present invention is polymerized to form a polyimide film. The polymer resin may contain: 5 to 95 wt. %, specifically 10 to 90 wt. % of a polyimide precursor having a structural unit represented by Formula (1); 5 to 95 wt. %, specifically 50 to 90 wt. % of polyimide having a structural unit represented by Formula (2); and 0 to 20 wt. %, specifically 0 to 15 wt. %, of a polyimide precursor having a structural unit represented by Formula (3).

[Formula 1]

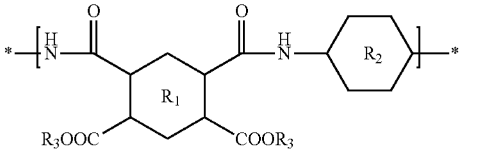

[Formula 2]

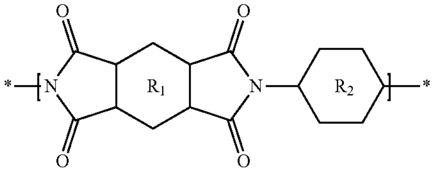

[Formula 3]

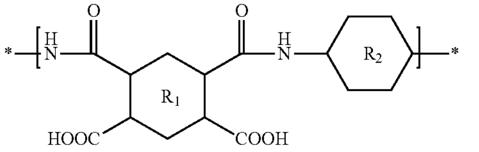

In Formulas 1 to 3, $R_1$ and $R_2$ may each independently be an organic group having 5 to 30 carbon atoms, specifically, an organic group having 5 to 20 carbon atoms. Hydrogen in the organic group may be substituted with a hydroxyl group (OH), methyl, or fluorine, and the methylene group may be substituted with oxygen or nitrogen. $R_3$ is a substituent derived from epoxy and, more specifically, may be a substituent represented by Formula (4).

[Formula 4]

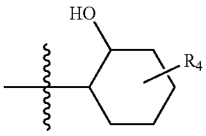

In Formula 4, $R_4$ is a linear, branched, or cyclic alkyl group having 1 to 12 carbon atoms, in which a hydrogen atom of the alkyl group may be substituted with 1 to 3 fluorine or hydroxyl groups, and the methylene group may be substituted with an alkenyl group, oxygen, nitrogen, ester (COO), or carbonyl (C═O).

As the substituent represented by Formula 4, $R_3$ is specifically a compound derived from a compound selected from the group consisting of epoxycyclohexylmethyl methacrylate (ECMMA), 1,2-epoxy-4-vinylcyclohexene, 3,4-(epoxycyclohexene)methyl-3',4'-epoxycyclohexylcarboxylate, and 3,4-epoxycyclohexylmethyl-3',4'-epoxycyclohexanecarboxylate modified epsilon-caprolactone. In particular, when a compound has an alkyl or alkyne structure as a cyclohexyl terminal substituent as in the 1,2-epoxy-4-vinylcyclohexene, the compound has better thermal stability than carboxylate. Therefore, the compound can be used as an insulating film for OLED, but the compound is limited thereto.

The polymer resin is prepared by polymerizing structural components of aromatic dianhydride and diamine. For example, the structural components of aromatic dianhydride and diamine are polymerized in a molar ratio of 1:0.6 to 1:1.4. When the molar ratio of the structural components of aromatic dianhydride and diamine is outside the range described above, the molecular weight of the resin becomes 3,000 or less, so that the polymer resin may be poor in mechanical and thermal properties.

The structural component of the aromatic dianhydride may be, for example, at least one selected from compounds represented by Formulas R1-1 to R1-7 below, and it is seen that in the polymer resin, the structure of $R_1$ is derived from the aromatic dianhydride shown below.

[Formula $R_1$-1]

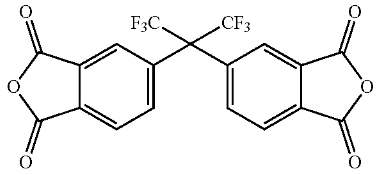

,

[Formula $R_1$-2]

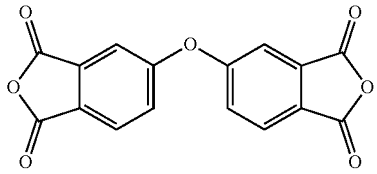

,

[Formula $R_1$-3]

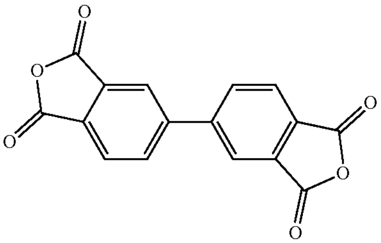

,

[Formula $R_1$-4]

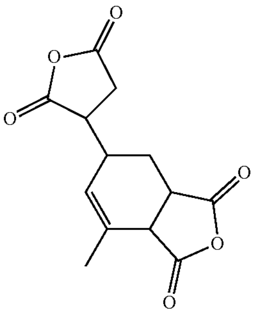

,

[Formula $R_1$-5]

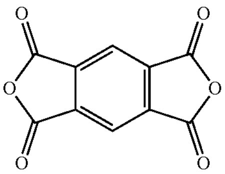

.

[Formula $R_1$-6]

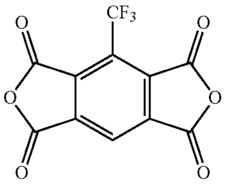

,

-continued

[Formula $R_1$-7]

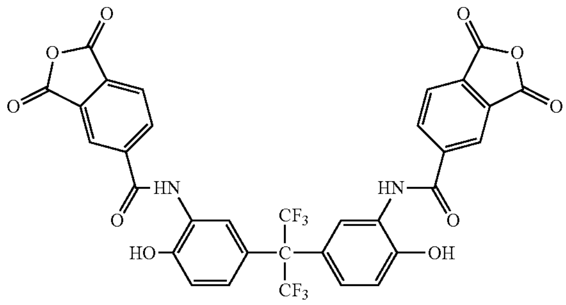

The structural component of the diamine may be, for example, at least one selected from compounds represented by Formulas $R_2$-1 to $R_2$-10, and preferably, it is an aromatic diamine. It can be seen that in the polymer resin, the structure of $R_2$ is a structure induced by the following diamine:

[Formula $R_2$-1]

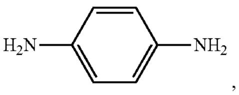

,

[Formula $R_2$-2]

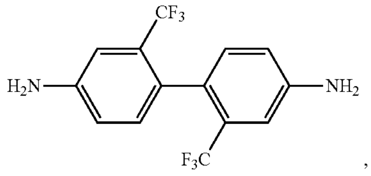

,

[Formula $R_2$-3]

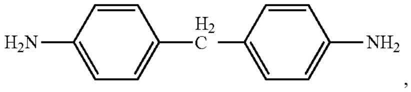

,

[Formula $R_2$-4]

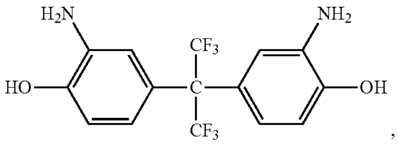

,

[Formula $R_2$-5]

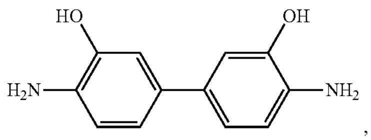

,

[Formula $R_2$-6]

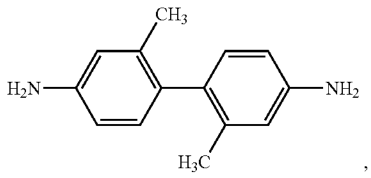

,

-continued

[Formula $R_2$-7]

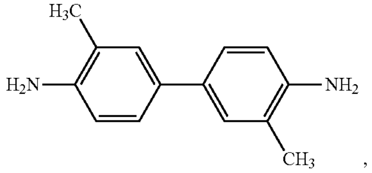

,

[Formula $R_2$-8]

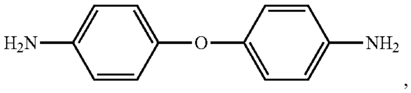

,

[Formula $R_2$-9]

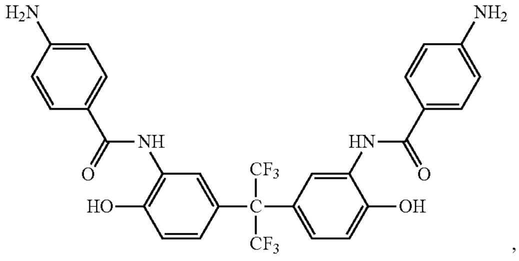

, and

[Formula $R_2$-10]

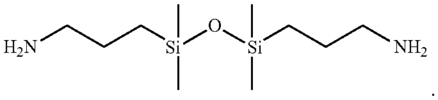

.

In the polyimide precursor having the structural unit represented by Formula 1, the content of the structural unit represented by Formula 1 is not particularly limited as long as it is possible to increase the development rate of the composition. For example, the content may be 0.1 to 100 mol % and specifically 5 to 100 mol % for the total number of repeating units.

In the polyimide precursor having the structural unit represented by Formula 1, for $R_3$, a substituent derived from an epoxy is used, thereby producing a material in which a hydroxyl group (OH) is substituted for the $R_3$ of the polyamic ester. When a polyimide precursor having a structural unit represented by Formula 1 including a polyamic ester structure substituted with a hydroxyl group (OH) is used as the photosensitive resin composition, the sensitivity is improved compared to the conventional photosensitive resin composition having no hydroxyl groups. As an example, when a positive photosensitive resin composition is applied to an OLED substrate, and the applied composition is soft backed for volatilization of the solvent and is exposed to light, the quinonediazide material changes from the hydrophobic state to the hydrophilic state. When the structural unit represented by Formula 1 has a hydroxyl group (OH), the development rate is further increased, resulting in improvement in sensitivity.

The weight average molecular weight (Mw) of the polyimide precursor having the structural unit represented by Formula 1 is in a range of 3,000 to 20,000, and more specifically in a range of 3,500 to 10,000. When the molecular weight of the polyimide precursor is excessively small, there is a problem in that mechanical and thermal properties after curing are not suitable for OLED. On the other hand, when the molecular weight is excessively large, there is a problem in that a large amount of light is required in the step of processing the resin composition, that is, the sensitivity is slowly controlled, resulting in an increase in OLED production cost.

The polyimide having the structural unit represented by Formula 2 can control the sensitivity. In the structure of Formula 2, when a hydroxyl group is substituted for $R_2$, the sensitivity can be quickly controlled. When fluorine is substituted, the sensitivity is slowly controlled. In the structural unit represented by Formula 2, $R_1$ and $R_2$ are the same as described above.

The weight average molecular weight (Mw) of the polyimide having the structural unit represented by Formula 2 is in a range of 4,000 to 20,000 and more specifically in a range of 3,500 to 10,000. When the molecular weight of the polyimide is excessively small, there is a problem in that mechanical and thermal properties after curing the resin composition are not suitable for OLED. On the other hand, when the molecular weight is excessively large, there is a problem in that a large amount of accumulated light is required in the step of processing the resin composition, that is, the sensitivity is slowly controlled, resulting in an increase in OLED production cost.

The polyimide precursor having a structural unit represented by Formula 3 has a polyamic acid structure including a carboxyl group. When this polyimide precursor has a hydroxyl group (OH) like the polyimide precursor having a structural unit represented by Formula 1, the development speed is increased, so that the sensitivity can be improved. However, when 20 wt. % or more of the structural unit represented by Formula 3 is included in the resin polymer composition, the difference in development between the exposed part and the non-exposed part, i.e., the contrast ratio, is small, so that the function as a photosensitizer is lost. In the structural unit represented by Formula 3, $R_1$ and $R_2$ are the same as described above.

The weight average molecular weight (Mw) of the polyimide having the structural unit represented by Formula 3 is in a range of 3,000 to 20,000 and more specifically in a range of 3,500 to 10,000. When the molecular weight of the polyimide precursor is excessively small, there is a problem in that mechanical and thermal properties after curing the resin composition are not suitable for OLED. On the other hand, when the molecular weight is excessively large, there is a problem in that a large amount of light is required in the step of processing the resin composition, that is, the sensitivity is slowly controlled, resulting in an increase in OLED production cost.

In the entire polymer resin, the content of the polyimide precursor having the structural unit represented by Formula 1 may be in a range of 5 to 95 wt. % and more specifically in a range of 10 to 90 wt. %, the content of the polyimide precursor having the structural unit represented by Formula 2 may be in a range of 5 to 95 wt. % and more specifically in a range of 50 to 90 wt. %, and the content of the polyimide precursor having the structural unit represented by Formula 3 may be in a range of 0 to 20 wt. % and more specifically in a range of 0 to 15 wt. %.

The polymer resin includes the polyimide precursor having a structural unit represented by Formula 1 and a polyimide having a structural unit represented by Formula 2 as main components. When the content of the polyimide precursor having a structural unit represented by Formula 1 or the polyimide having a structural unit represented by Formula 2 in the total polymer resin is less than 5 wt. %, scum and cracks of the photoresist are easily generated, or coating characteristics such as chemical resistance is deteriorated. When the content exceeds 95 wt. %, there is a problem in that the sensitivity increases and cracks occur.

The polymer resin contains, as a main component, a polyimide having a structural unit represented by Formula 2 as a main component. For example, the structural unit represented by Formula 2 may be contained in an amount of 50 to 95 wt. % and more specifically an amount of 60 to 95 wt. % in the total polymer resin. In this case, coating characteristics such as chemical resistance or effects such as crack prevention can be exhibited.

The quinonediazide compound is a photosensitive material that photoreacts to change from hydrophobic to hydrophilic after light exposure and is an essential compound for preparing the photosensitive resin composition. In particular, the quinonediazide compound is useful for control of the sensitivity. The quinonediazide compound is obtained by reacting a phenol compound with a naphthoquinonediazidesulfonic acid halogen compound, and the phenolic compound includes compounds Formulas 4-1 to 4-3 shown below.

[Formula 4-1]

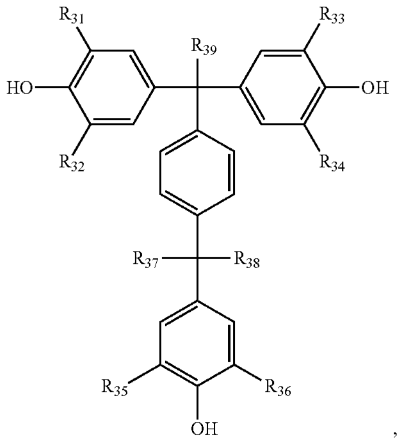

,

[Formula 4-2]

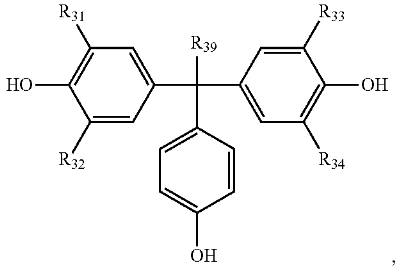

,

[Formula 4-3]

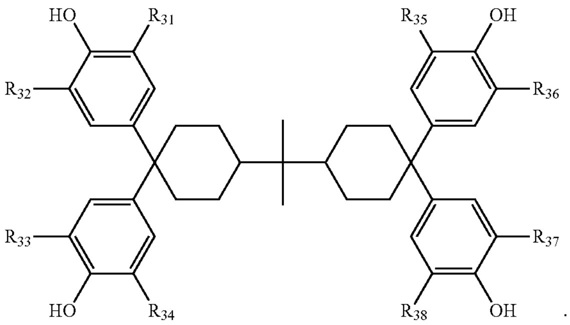

.

In Formulas 4-1 to 4-3, $R_{31}$ to $R_{36}$ are each independently hydrogen, halogen, a hydroxyl group, an alkyl group having 1 to 4 carbon atoms, or an alkenyl group having 1 to 4 carbon atoms, and $R_{37}$ and $R_{38}$ are each independently hydrogen, halogen, or an alkyl group having 1 to 4 carbon atoms, and $R_{39}$ is hydrogen or an alkyl group having 1 to 4 carbon atoms.

The content of the quinonediazide compound may be in a range of 5 to 50 parts by weight and more specifically in a range of 10 to 40 parts by weight, per 100 parts by weight of the polymer resin. When the quinonediazide compound is included in a small amount, the sensitivity increases excessively. When the quinonediazide compound is included in an excessively large amount, scum and cracks easily occur, or the photoresist coating properties such as chemical resistance are deteriorated.

Regarding the amount of the solvent, when the viscosity of the polymer resin and the quinonediazide compound is excessively high, when the composition is applied to a substrate, the solvent affects stains and the distribution of coating thicknesses. In order to reduce the stains and the distribution of coating thicknesses, when the solvent must be mixed with the polymer resin and the quinonediazide compound such that an appropriate viscosity can be maintained. The solvent having a boiling point of 230° C. or less is preferable, and the solvent is required to exhibit excellent solubility for the polymer resin and quinonediazide compound. Specifically, examples of the solvent may include gamma butyrolactone (GBL), N-methylpyrrolidone (NMP), propylene glycol methyl ether acetate (PGMEA), propylene glycol methyl ether (PGME), ethyl lactate (EL), methyl-3-methoxypropionate (MMP), and mixtures thereof. For example, the molar ratio of gamma-butyrolactone (GBL): methyl-3-methoxypropionate (MMP): propylene glycol methyl ether (PGME) may be 24: 20:56.

The content of the solvent may be in a range of 100 to 2,000 parts by weight and more specifically in a range of 250 to 1,500 parts by weight, per 100 parts by weight of the polymer resin. When the solvent is included in a small amount, there is a problem that precipitation of solid matter occurs while the resin composition is stored for a lengthy period of time. When the content of the solvent is excessive, there is a problem in that an appropriate coating thickness cannot be obtained in the process of forming an insulating film with the resin composition.

It is possible to achieve insulation between metal films on a substrate by applying, on the substrate, a positive photosensitive resin composition including: a polymer resin including a polyimide precursor having a structural unit represented by Formula 1, a polyimide having a structural unit represented by Formula 2, and a polyimide precursor having a structural unit represented by Formula 3; a quinonediazide compound, and a solvent. In order to supplement the characteristics of the insulating film, additives such as a thermal crosslinking agent, a thermal acid generator, a UV absorber, and a thermal base generator may be added solely or in combination.

The thermal crosslinking agent performs a crosslinking reaction with the polymer resin, thereby improving the chemical resistance of the photosensitive resin composition. The thermal crosslinking agent may be a phenol compound having Formula (a) and more specifically may include a functional group represented by Formula 5 shown below.

[Formula a]

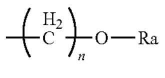

-continued

[Formula 5]

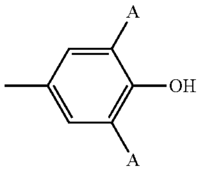

In Formula 5, A is Formula a shown below. In Formula a, n is an integer in a range of 1 to 6, and Ra is an alkyl having 1 to 3 carbon atoms.

The thermal crosslinking agent preferably may include a structure in which 1 to 4 functional groups represented by Formula 5 are bonded and may more specifically include compounds represented by Formulas 5-1 to Formula 5-4 shown below.

[Formula 5-1]

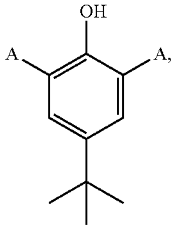

[Formula 5-2]

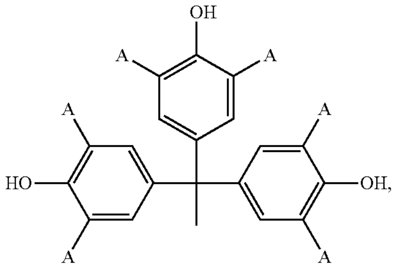

[Formula 5-3]

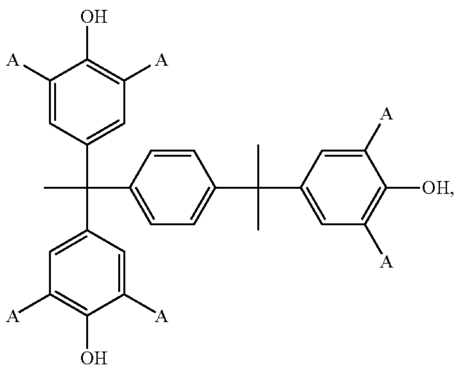

-continued

[Formula 5-4]

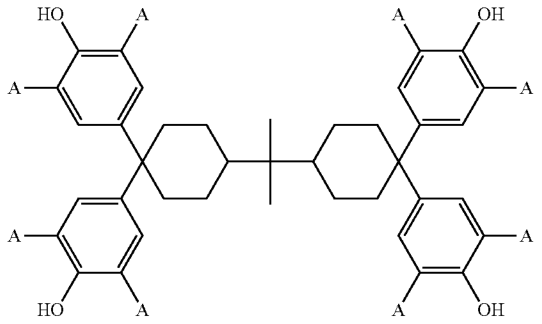

In Formulas 5-1 to 5-4, A is the same as described above.

The content of the thermal crosslinking agent may be in a range of 10 to 50 parts by weight and more specifically in a range of 10 to 30 parts by weight, per 100 parts by weight of the polyimide polymer. When the thermal crosslinking agent is used in a small amount, there is no chemical resistance effect. When the thermal crosslinking agent is used in an excessive amount, at the time of applying, softly baking, and developing the photosensitive resin composition on a substrate, the film reduction severely occurs. Thus, the polymer resin formed may be limited to a certain height.

The thermal acid generator serves to generate an acid at a temperature above a predetermined temperature and promotes a crosslinking reaction between the thermal crosslinking agent and the polymer resin. The content of the thermal acid generator is suitably in a range of 0.5 to 10 parts by weight per 100 parts by weight of the polyimide polymer. When the thermal acid generator is used in a small amount, the effect thereof is insignificant whereas when the thermal acid generator is used excessively, scum is generated.

When the photosensitive resin composition according to the present invention is applied to a substrate and is used as an insulating film, a UV absorber such as benzophenone or benzotriazole may be further added to prevent deterioration thereof when the photosensitive resin composition is exposed to external light for a lengthy period of time. The UV absorber may be, for example, 2-(2H-benzotriazol-2-yl)-phenol. The content of the UV absorber is suitably in a range of 0.01 to 2.0 parts by weight per 100 parts by weight of the polymer resin. When the UV absorber is used in a small amount, the effect thereof is insignificant whereas when the UV absorber is used excessively, heat resistance is reduced.

The present invention provides a method of manufacturing an insulating film made of a positive photosensitive resin composition. The insulating film can be used in display devices such as OLED, and has excellent high-sensitivity pattern developability, suppresses the occurrence of scum and cracks during pattern formation, and improves chemical resistance, adhesion, and the like.

The method of manufacturing the insulating film includes the steps of: applying the positive photosensitive resin composition to a substrate; drying the substrate; and exposing and developing the photosensitive resin composition on the substrate, followed by curing to form a polyimide film. For the application of the photosensitive resin composition, any known method in the art may be used without limitation. For example, spin coating, dip coating, roll coating, screen coating, spray coating, screen printing, etc. may be used. As the developing agent, a conventionally known developing agent may be used without limitation. For example, an aqueous alkali solution may be used. The thickness of the insulating film of the present invention may vary depending on the purpose. The thickness is preferably 1.0 to 15 μm, but the thickness is not limited thereto.

The present invention also provides a display device including a driving circuit, a planarization layer, a first electrode, an insulating layer, a light emitting layer, and a second electrode which are formed on a substrate, in which at least one of the planarization layer and the insulating layer is formed from the positive photosensitive resin composition.

Hereinafter, the present invention will be described in more detail with reference to examples, but the present invention is not limited by the examples.

[Synthesis Example 1] Synthesis of Polyimide Precursor (Formula 1)

Gamma butyrolactone (GBL, 313 g) was put into a 1000 mL flask, and 2,2-bis (3-amino-4-hydroxyphenyl) hexafluoropropane (bis-APAF, 71.8 g, 0.196 mol) and 1,3-bis(3-aminopropyl)tetramethyldisiloxane (SiDA, 0.99 g, 0.04 mol) were dissolved at 50° C. 3,3',4,4'-diphenyl ether tetracarboxylic dianhydride (ODPA, 46.5 g, 0.15 mol) was added thereto, and the mixture was stirred at 70° C. for 25 hours. Next, phthalic anhydride (14.8 g, 0.1 mol) was added, and the reaction was performed for 2 hours. Next, dimethylformamide dimethyl acetal (DFA, 17.8 g, 0.15 mol) was added thereto, and the mixture was stirred at 70° C. for 4 hours. After the reaction, a polyimide precursor was obtained.

[Synthesis Example 2] Synthesis of Polyimide Precursor (Formula 1)

Gamma butyrolactone (GBL, 309 g) was put into a 1000 mL flask. 2,2-bis (3-amino-4-hydroxyphenyl) hexafluoropropane (bis-APAF, 68.1 g, 0.196 mol), 4,4,'-oxydianiline (2.0 g, 0.01 mole), and 1,3-bis(3-aminopropyl)tetramethyldisiloxane (SiDA, 0.99 g, 0.04 mol) were dissolved at 50° C. 3,3',4,4'-diphenyl ether tetracarboxylic dianhydride (ODPA, 47.8 g, 0.154 mol) was added thereto, and the mixture was stirred at 70° C. for 25 hours. Next, phthalic anhydride (13.63 g, 0.092 mol) was added, and the reaction was performed for 2 hours. Next, dimethylformamide dimethyl acetal (DFA, 18.3 g, 0.154 mol) was added thereto, and the mixture was stirred at 70° C. for 4 hours. After the reaction, a polyimide precursor was obtained.

[Synthesis Example 3] Synthesis of Polyimide Precursor (Formula 1)

Gamma butyrolactone (GBL, 329 g) was put into a 1000 mL flask, and 2,2-bis (3-amino-4-hydroxyphenyl) hexafluoropropane (bis-APAF, 71.8 g, 0.196 mol) and 1,3-bis(3-aminopropyl)tetramethyldisiloxane (SiDA, 0.99 g, 0.04 mol) were dissolved at 50° C. 3,3',4,4'-diphenyl ether tetracarboxylic dianhydride (ODPA, 32.3 g, 0.104 mol) and 4,4'-(hexafluoroisopropylidene)diphthalic anhydride (6FDA, 22.2 g, 0.05 mol) were added thereto, and the mixture was stirred at 70° C. for 25 hours. Next, phthalic anhydride (13.6 g, 0.092 mol) was added, and the reaction was performed for 2 hours. Next, dimethylformamide dimethyl acetal (DFA, 18.3 g, 0.154 mol) was added thereto, and the mixture was stirred at 70° C. for 4 hours. After the reaction, a polyimide precursor was obtained.

[Synthesis Example 4] Synthesis of Polyimide Precursor (Formula 1)

Except that 1,2-epoxy-4-vinylcyclohexane (37.25 g, 0.3 mol) and triethylamine (0.81 g, 0.008 mol) were put into a flask instead of the dimethylformamide dimethylacetal, a polyimide precursor was synthesized in the same manner as in Synthesis Example 1. After 48 hours of stirring and reaction, a polyimide precursor was obtained.

[Synthesis Example 5] Synthesis of Polyimide Precursor (Formula 1)

Except that 1,2-epoxy-4-vinylcyclohexane (38.25 g, 0.308 mol) and triethylamine (0.81 g, 0.008 mol) were put into a flask instead of the dimethylformamide dimethylacetal, a polyimide precursor was synthesized in the same manner as in Synthesis Example 2. After 48 hours of stirring and reaction, a polyimide precursor was obtained.

[Synthesis Example 6] Synthesis of Polyimide Precursor (Formula 1)

Except that 1,2-epoxy-4-vinylcyclohexane (38.25 g, 0.308 mol) and triethylamine (0.81 g, 0.008 mol) were put into a flask instead of the dimethylformamide dimethylacetal, a polyimide precursor was synthesized in the same manner as in Synthesis Example 3. After 48 hours of stirring and reaction, a polyimide precursor was obtained.

[Synthesis Example 7] Synthesis of Polyimide (Formula 2)

Gamma butyrolactone (GBL, 294 g) was put into a 1000 mL flask, and 2,2-bis (3-amino-4-hydroxyphenyl) hexafluoropropane (bis-APAF, 49.81 g, 0.136 mol) and 1,3-bis(3-aminopropyl)tetramethyldisiloxane (SiDA, 0.99 g, 0.04 mol) were dissolved at 50° C. 3,3',4,4'-diphenyl ether tetracarboxylic dianhydride (ODPA, 62.0 g, 0.20 mol) was added thereto, and the mixture was stirred at 50° C. for 4 hours. Next, 3-aminophenol (13.1 g, 0.12 mol) was added, and the reaction was performed for 2 hours. Next, 60 mL of toluene was added thereto, and the mixture was stirred at 150° C. for 2 hours and at 180° C. for 2 hours for reaction. The reaction was terminated, and polyimide was obtained.

[Synthesis Example 8] Synthesis of Polyimide (Formula 2)

Gamma butyrolactone (GBL, 313 g) was put into a 1000 mL flask, and 2,2-bis (3-amino-4-hydroxyphenyl) hexafluoropropane (bis-APAF, 71.79 g, 0.196 mol) and 1,3-bis(3-aminopropyl)tetramethyldisiloxane (SiDA, 0.99 g, 0.04 mol) were dissolved at 50° C. 3,3',4,4'-diphenyl ether tetracarboxylic dianhydride (ODPA, 46.5 g, 0.15 mol) was added thereto, and the mixture was stirred at 50° C. for 4 hours. Next, phthalic anhydride (14.8 g, 0.10 mol) was added, and the reaction was performed for 2 hours. Next, 60 mL of toluene was added thereto, and the mixture was stirred at 150° C. for 2 hours and at 180° C. for 2 hours for reaction. The reaction was terminated, and polyimide was obtained.

[Synthesis Example 9] Synthesis of Polyimide Precursor (Formula 1)

Gamma butyrolactone (GBL, 316 g) was put into a 1000 mL flask, and 2,2-bis (3-amino-4-hydroxyphenyl) hexafluoropropane (bis-APAF, 71.8 g, 0.196 mol) and 1,3-bis(3-aminopropyl)tetramethyldisiloxane (SiDA, 0.99 g, 0.04 mol) were dissolved at 50° C. Here, 4,4'-(hexafluoroisopropylidene)diphthalic anhydride (6FDA, 17.77 g, 0.04 mol), 5-(2,5-dioxotetrahydrofuryl)-3-methyl-3-cyclohexene-1,2-dicarboxylic anhydride (18.5 g, 0.07 mol), and 2,3,3',4'-biphenyltetracarboxylic dianhydride (17.7 g, 0.06 mol) were added thereto, followed by stirring at 70° C. for and 25 hours. Next, phthalic anhydride (8.89 g, 0.06 mol) was added, and 2 hours of reaction was performed. Next, the temperature of the reactor was raised to 130° C., the reaction was performed for 30 hours, and the temperature was then lowered to 70° C. Next, 1,2-epoxy-4-vinylcyclohexane (29.8 g, 0.24 mol) and triethylamine (0.81 g, 0.008 mol) were added thereto, followed by stirring at 70° C. for 48 hours. After the 48 hours of stirring, the reaction was terminated, and a polyimide precursor was obtained.

[Synthesis Example 10] Synthesis of Polyimide Precursor (Formula 1)

Gamma butyrolactone (GBL, 321 g) was put into a 1000 mL flask, and 2,2-bis (3-amino-4-hydroxyphenyl) hexafluoropropane (bis-APAF, 71.8 g, 0.196 mol) and 1,3-bis(3-aminopropyl)tetramethyldisiloxane (SiDA, 0.99 g, 0.04 mol) were dissolved at 50° C. Here, 4,4'-(hexafluoroisopropylidene)diphthalic anhydride (6FDA, 22.21 g, 0.05 mol), 5-(2,5-dioxotetrahydrofuryl)-3-methyl-3-cyclohexene-1,2-dicarboxylic anhydride (13.21 g, 0.05 mol), and 2,3,3',4'-biphenyltetracarboxylic dianhydride (20.6 g, 0.07 mol) were added thereto, followed by stirring at 70° C. for 25 hours. Next, phthalic anhydride (8.89 g, 0.06 mol) was added, and 2 hours of reaction was further performed. Next, the temperature of the reactor was raised to 130° C., the reaction was performed for 30 hours, and the temperature was then lowered to 70° C. Next, 1,2-epoxy-4-vinylcyclohexane (19.9 g, 0.16 mol) and triethylamine (0.81 g, 0.008 mol) were added thereto, followed by stirring at 70° C. for 48 hours. After the 48 hours of stirring, the reaction was terminated, and a polyimide precursor was obtained.

[Synthesis Example 11] Synthesis of Polyimide Precursor (Formula 1)

Gamma butyrolactone (GBL, 327 g) was put into a 1000 mL flask, and 2,2-bis (3-amino-4-hydroxyphenyl) hexafluoropropane (bis-APAF, 71.79 g, 0.196 mol) and 1,3-bis(3-aminopropyl)tetramethyldisiloxane (SiDA, 0.99 g, 0.04 mol) were dissolved at 50° C. Next, 4,4'-(hexafluoroisopropylidene)diphthalic anhydride (6FDA, 22.21 g, 0.05 mol), 2,3,3',4'-biphenyltetracarboxylic dianhydride (14.7 g, 0.05 mol), and 3,3',4,4'-diphenyl ethertetracarboxylic dianhydride (ODPA, 21.7 g, 0.07 mol) were added thereto, followed by stirring at 70° C. for 25 hours. Next, phthalic anhydride (8.89 g, 0.06 mol) was added, and 2 hours of reaction was further performed. Next, the temperature of the reactor was raised to 130° C., the reaction was performed for 30 hours, and the temperature was then lowered to 70° C. Next, 1,2-epoxy-4-vinylcyclohexane (19.9 g, 0.16 mol) and triethylamine (0.81 g, 0.008 mol) were added thereto, followed by stirring at 70° C. for 48 hours. After the 48 hours of stirring, the reaction was terminated, and a polyimide precursor was obtained.

[Synthesis Example 12] Synthesis of Polyimide Precursor (Formula 3)

Gamma butyrolactone (GBL, 327 g) was put into a 1000 mL flask, and 2,2-bis (3-amino-4-hydroxyphenyl) hexafluoropropane (bis-APAF, 71.79 g, 0.196 mol) and 1,3-bis(3-aminopropyl)tetramethyldisiloxane (SiDA, 0.99 g, 0.04 mol) were dissolved at 50° C. Next, 4,4'-(hexafluoroisopropylidene)diphthalic anhydride (6FDA, 22.21 g, 0.05 mol), 2,3,3',4'-biphenyltetracarboxylic dianhydride (14.7 g, 0.05 mol), and 3,3',4,4'-diphenyl ethertetracarboxylic dianhydride (ODPA, 21.7 g, 0.07 mol) were added thereto, followed by stirring at 70° C. for 25 hours. Next, phthalic anhydride (8.89 g, 0.06 mol) was added, and 2 hours of reaction was further performed to synthesize polyamic acid.

[Examples 1 to 26 and Comparative Examples 1 to 11] Preparation of Photosensitive Resin Composition Photosensitive resin compositions were prepared by mixing the polyimide and the polyimide precursors prepared in Synthesis Examples 1 to 12 according to the ratios shown in Table 1 below. Specifically, after checking the solid content in the polyimide and polyimide precursor synthesized in Synthesis Examples 1 to 12, the quinonediazide and the thermal crosslinking agent were mixed in predetermined amounts per 100 parts by weight of the polymer resin according to the ratios shown in Table 1 below. Thereafter, a solvent in which GBL, MMP, and PGM were mixed in a molar ratio of 24:20:56 was used to prepare a photosensitive resin composition having a solid content of 13%.

Among compounds shown in Table 1 below, as Tris-TPPA used as a quinonediazide compound, a compound represented by Formula 4-1-1 was used, and, as Tris-THAP, a compound represented by Formula 4-2-1 was used. In addition, when a thermal crosslinking agent having a structure represented by Formula 5-2 or 5-3 is used, for A, a thermal crosslinking agent in which n of Formula a is 1 and Ra is a methyl group was used.

[Formula 4-1-1]

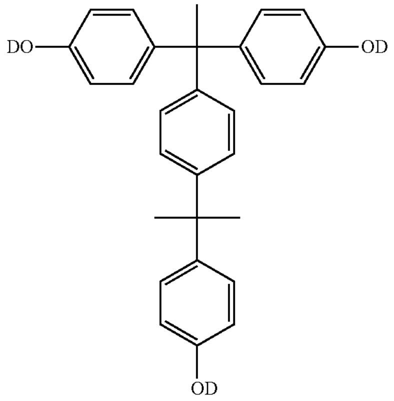

-continued

D =

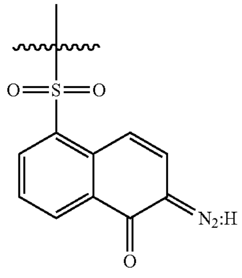

2:I

[Formula 4-2-1]

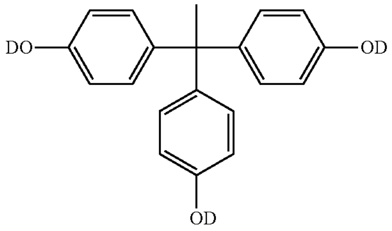

D =

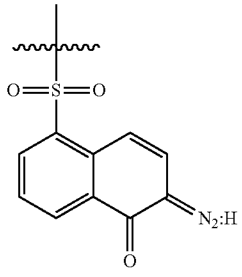

2:I

TABLE 1

| Classification | | Polymer resin | | Quinone diazide | Thermal crosslinking agent | |
|---|---|---|---|---|---|---|
| Comparative Example 1 | Type of material | Synthesis Example 1 | Synthesis Example 8 | Tris-TPPA | 0 | 0 |
| | Solid matter (parts by weight) | 50 | 50 | 30 | | |

TABLE 1-continued

| Classification | Polymer resin | | Quinone diazide | | Thermal crosslinking agent | |
|---|---|---|---|---|---|---|
| Comparative Example 2 | Type of material | Synthesis Example 2 | Synthesis Example 8 | Tris-TPPA | 0 | 0 |
| | Solid matter (parts by weight) | 50 | 50 | 30 | | |
| Comparative Example 3 | Type of material | Synthesis Example 3 | Synthesis Example 8 | Tris-TPPA | 0 | 0 |
| | Solid matter (parts by weight) | 50 | 50 | 30 | | |
| Comparative Example 4 | Type of material | Synthesis Example 4 | — | Tris-TPPA | 0 | 0 |
| | Solid matter (parts by weight) | 100 | — | 30 | | |
| Comparative Example 5 | Type of material | Synthesis Example 8 | — | Tris-TPPA | 0 | 0 |
| | Solid matter (parts by weight) | 100 | — | 30 | | |
| Comparative Example 6 | Type of material | Synthesis Example 4 | Synthesis Example 8 | Tris-TPPA | 0 | 0 |
| | Solid matter (parts by weight) | 98 | 2 | 30 | | |
| Comparative Example 7 | Type of material | Synthesis Example 4 | Synthesis Example 8 | Tris-TPPA | 0 | 0 |
| | Solid matter (parts by weight) | 2 | 98 | 30 | | |
| Comparative Example 8 | Type of material | Synthesis Example 4 | Synthesis Example 8 | Tris-TPPA | 0 | 0 |
| | Solid matter (parts by weight) | 50 | 50 | 3 | | |
| Comparative Example 9 | Type of material | Synthesis Example 4 | Synthesis Example 8 | Tris-TPPA | 0 | 0 |
| | Solid matter (parts by weight) | 50 | 50 | 4 | | |
| Comparative Example 10 | Type of material | Synthesis Example 4 | Synthesis Example 8 | Tris-TPPA | 0 | 0 |
| | Solid matter (parts by weight) | 50 | 50 | 51 | | |
| Comparative Example 11 | Type of material | Synthesis Example 4 | Synthesis Example 8 | Tris-TPPA | 0 | 0 |
| | Solid matter (parts by weight) | 50 | 50 | 55 | | |

TABLE 1-continued

| Classification | | Polymer resin | | Quinone diazide | Thermal crosslinking agent | |
|---|---|---|---|---|---|---|
| Example 1 | Type of material | Synthesis Example 4 | Synthesis Example 8 | Tris-TPPA | 0 | 0 |
| | Solid matter (parts by weight) | 50 | 50 | 30 | | |
| Embodiment 2 | Type of material | Synthesis Example 5 | Synthesis Example 8 | Tris-TPPA | 0 | 0 |
| | Solid matter (parts by weight) | 50 | 50 | 30 | | |
| Example 3 | Type of material | Synthesis Example 6 | Synthesis Example 8 | Tris-TPPA | 0 | 0 |
| | Solid matter (parts by weight) | 50 | 50 | 30 | | |
| Example 4 | Type of material | Synthesis Example 4 | Synthesis Example 8 | Tris-TPPA | 0 | 0 |
| | Solid matter (parts by weight) | 95 | 5 | 30 | | |
| Example 5 | Type of material | Synthesis Example 4 | Synthesis Example 8 | Tris-TPPA | 0 | 0 |
| | Solid matter (parts by weight) | 5 | 95 | 30 | | |
| Example 6 | Type of material | Synthesis Example 5 | Synthesis Example 7 | Tris-TPPA | 0 | 0 |
| | Solid matter (parts by weight) | 5 | 95 | 30 | | |
| Example 7 | Type of material | Synthesis Example 5 | Synthesis Example 7 | Tris-TPPA | 0 | 0 |
| | Solid matter (parts by weight) | 10 | 90 | 30 | | |
| Example 8 | Type of material | Synthesis Example 5 | Synthesis Example 7 | Tris-TPPA | 0 | 0 |
| | Solid matter (parts by weight) | 50 | 50 | 30 | | |
| Example 9 | Type of material | Synthesis Example 6 | Synthesis Example 8 | Tris-TPPA | 0 | 0 |
| | Solid matter (parts by weight) | 5 | 95 | 30 | | |
| Example 10 | Type of material | Synthesis Example 6 | Synthesis Example 8 | Tris-TPPA | 0 | 0 |
| | Solid matter (parts by weight) | 10 | 90 | 30 | | |

TABLE 1-continued

| Classification | | Polymer resin | | Quinone diazide | Thermal crosslinking agent | |
|---|---|---|---|---|---|---|
| Example 11 | Type of material | Synthesis Example 6 | Synthesis Example 8 | Tris-TPPA | 0 | 0 |
| | Solid matter (parts by weight) | 50 | 50 | 25 | | |
| Example 12 | Type of material | Synthesis Example 6 | Synthesis Example 8 | Tris-PHAP | 0 | 0 |
| | Solid matter (parts by weight) | 50 | 50 | 20 | | |
| Example 13 | Type of material | Synthesis Example 6 | Synthesis Example 8 | Tris-PHAP | 0 | 0 |
| | Solid matter (parts by weight) | 50 | 50 | 15 | | |
| Example 14 | Type of material | Synthesis Example 4 | Synthesis Example 8 | Tris-TPPA | 0 | 0 |
| | Solid matter (parts by weight) | 50 | 50 | 50 | | |
| Example 15 | Type of material | Synthesis Example 4 | Synthesis Example 8 | Tris-TPPA | 0 | 0 |
| | Solid matter (parts by weight) | 50 | 50 | 15 | | |
| Example 16 | Type of material | Synthesis Example 4 | Synthesis Example 8 | Tris-THAP | 0 | 0 |
| | Solid matter (parts by weight) | 50 | 50 | 30 | | |
| Example 17 | Type of material | Synthesis Example 4 | Synthesis Example 8 | Tris-THAP | 0 | 0 |
| | Solid matter (parts by weight) | 50 | 50 | 15 | | |
| Example 18 | Type of material | Synthesis Example 9 | Synthesis Example 7 | Tris-TPPA | 0 | 0 |
| | Solid matter (parts by weight) | 95 | 5 | 25 | | |
| Example 19 | Type of material | Synthesis Example 10 | Synthesis Example 7 | Tris-TPPA | 0 | 0 |
| | Solid matter (parts by weight) | 95 | 5 | 25 | | |
| Example 20 | Type of material | Synthesis Example 11 | Synthesis Example 7 | Tris-THAP | 0 | 0 |
| | Solid matter (parts by weight) | 95 | 5 | 25 | | |

TABLE 1-continued

| Classification | | Polymer resin | | | Quinone diazide | Thermal crosslinking agent | |
|---|---|---|---|---|---|---|---|
| Example 21 | Type of material | Synthesis Example 5 | Synthesis Example 7 | | Tris-TPPA | Formula 5-3 | |
| | Solid matter (parts by weight) | 5 | 95 | | 30 | 15 | |
| Example 22 | Type of material | Synthesis Example 5 | Synthesis Example 7 | | Tris-TPPA | Formula 5-2 | Formula 5-3 |
| | Solid matter (parts by weight) | 10 | 90 | | 30 | 7 | 8 |
| Example 23 | Type of material | Synthesis Example 5 | Synthesis Example 7 | | Tris-TPPA | Formula 5-2 | Formula 5-3 |
| | Solid matter (parts by weight) | 50 | 50 | | 30 | 10 | 5 |
| Example 24 | Type of material | Synthesis Example 6 | Synthesis Example 8 | | Tris-TPPA | Formula 5-3 | |
| | Solid matter (parts by weight) | 5 | 95 | | 30 | 10 | |
| Example 25 | Type of material | Synthesis Example 6 | Synthesis Example 8 | | Tris-TPPA | Formula 5-3 | |
| | Solid matter (parts by weight) | 10 | 90 | | 30 | 15 | |
| Example 26 | Type of material | Synthesis Example 6 | Synthesis Example 8 | Synthesis Example 12 | Tris-TPPA | Formula 5-3 | |
| | Solid matter (parts by weight) | 10 | 80 | 10 | 30 | 15 | |

(Unit: parts by weight)

(Unit: parts by weight)

[Experimental Example] Evaluation of Physical Characteristics

The photosensitive resin compositions of Comparative Examples 1 to 10 and Examples 1 to 26 synthesized in the ratios shown in Table 1 above were coated on respective substrates. Thereafter, a thin film was formed on a glass substrate using a spin coater and dried on a hot plate at 120° C. for 2 minutes, so that a film with a thickness of 2.0 μm was obtained. Using the prepared substrate, the physical properties of the photoresist, such as sensitivity, scum, cracks, chemical resistance, adhesion, and OLED reliability, were measured. The results are shown in Table 2 below.

1. Measurement of Sensitivity

Using a predetermined pattern mask formed on the manufactured substrate, ultraviolet rays having an intensity of 20 $mW/cm^2$ in a broadband were emitted at a reference dose required for formation of a 5 μm contact hole CD. After the UV exposure, the photoresist was developed with an aqueous solution of 2.38 parts by weight of tetramethylammonium hydroxide at 23° C. for 1 minute, followed by washing with ultrapure water for 1 minute. Then, it was cured in an oven at 250° C. for 60 minutes to obtain a patterned film having a contact hole CD of 5 μm. A sensitivity of 40 to 150 $mJ/cm^2$ is an appropriate result value.

2. Measurement of Scum

During the sensitivity measurement, the inside of the pattern was observed with SEM to check whether residues were present in lines, spaces, and contact holes. The case where the development residue was present was denoted as X, the case where the development residue was present only in a pattern boundary portion was denoted by Δ, and the case where the development residue was absent was denoted by ○.

3. Measurement of Crack

Cracks on the manufactured substrate were observed by naked eye inspection and microscope inspection with 100 times magnification. The case where cracks were present was denoted by X, the case where cracks were present only in a coating boundary region was denoted by Δ, and the case where cracks were absent was denoted by ○.

4. Measurement of Chemical Resistance

The prepared substrate was dipped in methylpyrrolidone (NMP) at 60° C. for 120 seconds, and the change of the cured film thickness before and after the dipping was measured. The case where the change was less than 150 Å was denoted by ◎, the case where the change was 150 Å or more and less than 300 Å was denoted by ○, the case where the change was 300 Å or more and less than 600 Å was denoted by Δ, and the case where the change was more than 600 Å was denoted by X.

5. Measurement of Adhesive Strength

A pattern film was formed in the same manner as in the section titled "Measurement of Sensitivity", and the adhesive strengths varying depending on the bake temperatures were compared for a case where the pattern has a 10 μm line width and a 1:1 slit width. The case where the adhesive strength was secured when the pre-bake is performed in a temperature range of 90° C. to 100° C. was denoted by ○, the case where the adhesive strength was secured when the pre-bake was performed in a temperature range of 105° C. to 115° C. was denoted by Δ, and the case where the adhesive strength was secured or not when the pre-bake was performed in a temperature range of 120° C. or higher was denoted by X.

6. Measurement of OLED Reliability

A pattern film can be formed in the same way as in the section titled "Measurement of Sensitivity. FIG. 1 is a view showing that a pattern film is formed on an ITO substrate on which a pattern is formed, and EL is then deposited. Referring to FIG. 1, Al was deposited as a cathode electrode on the top, and an encapsulation process was performed. In conditions of 85° C., 85% RH, and device-turned-on, the time $T_{97}$ within which the luminance drops by 3% was measured. The case where the time $T_{97}$ was longer than 1000 hours was denoted by O, and the case where time $T_{97}$ was shorter than 1000 hours was denoted by X.

TABLE 2

| Classification | Sensitivity ($mJ/cm^2$) | Scum | Crack | Chemical resistance | Adhesion | OLED reliability |
|---|---|---|---|---|---|---|
| Comparative Example 1 | 85 | X | X | X | X | X |
| Comparative Example 2 | 103 | X | X | X | X | X |
| Comparative Example 3 | 95 | X | X | X | X | X |
| Comparative Example 4 | 126 | X | X | X | X | X |
| Comparative Example 5 | 65 | X | X | X | X | X |
| Comparative Example 6 | 120 | X | ○ | X | X | X |
| Comparative Example 7 | 71 | X | X | X | X | ○ |
| Comparative Example 8 | 270 | X | X | X | X | X |
| Comparative Example 9 | 272 | X | X | X | X | X |
| Comparative Example 10 | 57 | X | X | X | X | X |
| Comparative Example 11 | 51 | X | X | X | X | X |
| Example 1 | 72 | ○ | ○ | ○ | ○ | ○ |

TABLE 2-continued

| Classification | Sensitivity ($mJ/cm^2$) | Scum | Crack | Chemical resistance | Adhesion | OLED reliability |
|---|---|---|---|---|---|---|
| Example 2 | 92 | ○ | ○ | ○ | ○ | ○ |
| Example 3 | 81 | ○ | ○ | ○ | ○ | ○ |
| Example 4 | 85 | ○ | ○ | ○ | ○ | ○ |
| Example 5 | 62 | ○ | ○ | ○ | ○ | ○ |
| Example 6 | 69 | ○ | ○ | ○ | ○ | ○ |
| Example 7 | 74 | ○ | ○ | ○ | ○ | ○ |
| Example 8 | 88 | ○ | ○ | ○ | ○ | ○ |
| Example 9 | 71 | ○ | ○ | ○ | ○ | ○ |
| Example 10 | 58 | ○ | ○ | ○ | ○ | ○ |
| Example 11 | 81 | ○ | ○ | ○ | ○ | ○ |
| Example 12 | 87 | ○ | ○ | ○ | ○ | ○ |
| Example 13 | 87 | ○ | ○ | ○ | ○ | ○ |
| Example 14 | 57 | ○ | ○ | ○ | ○ | ○ |
| Example 15 | 80 | ○ | ○ | ○ | ○ | ○ |
| Example 16 | 66 | ○ | ○ | ○ | ○ | ○ |
| Example 17 | 68 | ○ | ○ | ○ | ○ | ○ |
| Example 18 | 73 | ○ | ○ | ○ | ○ | ○ |
| Example 19 | 66 | ○ | ○ | ○ | ○ | ○ |
| Example 20 | 54 | ○ | ○ | ○ | ○ | ○ |
| Example 21 | 61 | ○ | ○ | ◎ | ○ | ○ |
| Example 22 | 71 | ○ | ○ | ◎ | ○ | ○ |
| Example 23 | 79 | ○ | ○ | ◎ | ○ | ○ |
| Example 24 | 66 | ○ | ○ | ◎ | ○ | ○ |
| Example 25 | 50 | ○ | ○ | ◎ | ○ | ○ |
| Example 26 | 45 | ○ | ○ | ◎ | ○ | ○ |

As shown in Table 2, Comparative Examples 1 to 3 were polyimide precursors prepared according to Synthesis Examples 1 to 3 and including a structure represented by Formula 1 in which $R_3$ was alkyl. In contrast, Examples 1 to 3 were polyimide precursors prepared according to Synthesis Examples 4 to 6 including a structure represented by Formula 1 in which $R_3$ was derived from an epoxy compound. When compared, Examples 1 to 3 exhibited 10% improvement in the sensitivity and improvements in physical properties such as scum, cracks, chemical resistance, adhesive strength, and OLED reliability. As in Comparative Examples 4 to 7, in the case of using a polymer resin synthesized from only a polyimide precursor having a structural unit represented by Formula 1 or a polyimide having a structural unit represented by Formula 2, or in the case of using a polymer resin in which only a polyimide precursor having a structural unit represented by Formula 1 or a polyimide precursor having a structural unit represented by Formula 2 is included in an amount of 5 wt. % or less, poor physical properties such as scum, cracks, chemical resistance, adhesive strength, and OLED reliability were exhibited than the cases where the polymer resins of Examples 1 to 3 were used.

As in Comparative Examples 8 to 11, when the amount of quinonediazide which is a photosensitive material is included in an amount of less than 5 parts in the polymer resin, it is seen that the sensitivity is extremely high (Comparative Examples 8 and 9). On the other hand, when the quinonediazide is included in an amount exceeding 50 parts by weight in the polymer resin, the sensitivity is lowered, and when compared with Examples 1 to 3, physical properties such as scum, crack, chemical resistance, adhesion, OLED reliability are not good.

Referring to Examples 1 to 21, it is seen that the sensitivity is suitable to be applicable to OLED substrates, and the scum, crack, chemical resistance, adhesion, and OLED reliability are relatively good. In particular, in Examples 22 to 26 in which a thermal crosslinking agent is used, it is seen that the chemical resistance is very excellent.

LIST OF REFERENCE NUMERALS

1 Indium tin oxide (ITO)
2 Insulator
3 Electroluminescent lighting & aluminum (EL&Al)

What is claimed is:

1. A positive photosensitive resin composition comprising:

a polymer resin comprising i) 5 to 95 wt. % of a polyimide precursor having a structural unit represented by Formula 1, ii) 5 to 95 wt. % of a polyimide precursor having a structural unit represented by Formula 2, and iii) 0 to 20 wt. % of a polyimide precursor having a structural unit represented by Formula 3;

5 to 50 parts by weight of a quinonediazide compound per 100 parts by weight of the polymer resin; and 100 to 2,000 parts by weight of a solvent per 100 parts by weight of the polymer resin,

[Formula 1]

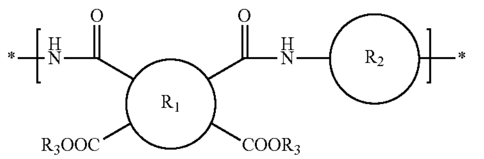

[Formula 2]

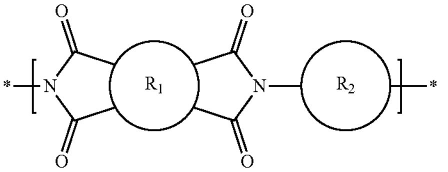

[Formula 3]

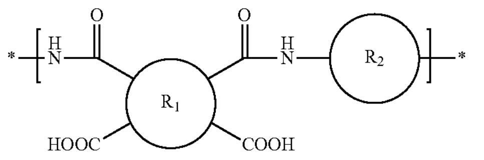

wherein $R^1$ and $R^2$ are each independently an organic group having 5 to 30 carbon atoms, wherein in the organic group, hydrogen can be substituted with a hydroxyl group (OH), methyl, or fluorine, the methylene group can be substituted with oxygen or nitrogen, and $R^3$ is a substituent derived from epoxy.

2. The positive photosensitive resin composition of claim 1, wherein $R^3$ is a substituent represented by Formula 4:

[Formula 4]

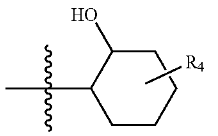

wherein $R_4$ is a linear, branched, or cyclic alkyl group having 1 to 12 carbon atoms, wherein the hydrogen atom of the alkyl group can be substituted with 1 to 3 fluorine atoms or hydroxyl groups, and the methylene group can be substituted with an alkenyl group, oxygen, nitrogen, ester (COO), or carbonyl (C═O).

3. The positive photosensitive resin composition of claim 1, wherein $R_3$ is derived from a compound selected from the group consisting of epoxycyclohexylmethylmethacrylate, 1,2-epoxy-4-vinylcyclohexene, 3,4-(epoxycyclohexene) methyl-3',4'-epoxycyclohexylcarboxylate, and 3,4-epoxycyclo hexylmethyl-3',4'-epoxycyclohexenecarboxylate modified epsilon-caprolactone.

4. The positive photosensitive resin composition of claim 1, wherein each of the polyimide precursor having a structural unit represented by Formula 1, the polyimide precursor having a structural unit represented by Formula 2, and the polyimide precursor having a structural unit represented by Formula 3 has a weight average molecular weight in a range of 3,500 to 20,000.

5. The positive photosensitive resin composition of claim 1, wherein the polymer resin contains 50 to 95 wt. % of a polyimide having a structural unit represented by Formula 2.

6. The positive photosensitive resin composition of claim 1, wherein the quinonediazide compound is obtained by reacting a phenol compound selected from the group consisting of compounds represented by Formulas 4-1 to 4-3 and a naphthoquinonediazidesulfonic halogen compound:

[Formula 4-1]

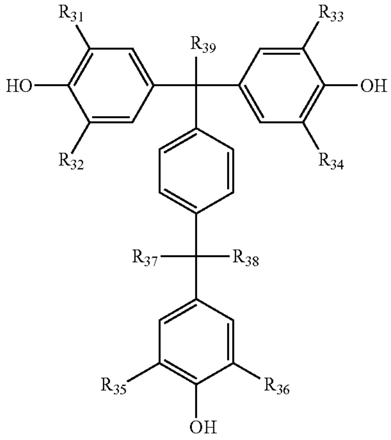

-continued

[Formula 4-2]

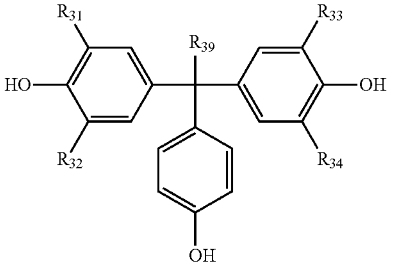

[Formula 4-3]

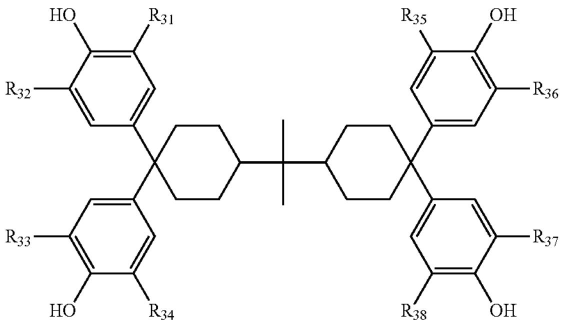

wherein $R_{31}$ to $R_{36}$ are each independently hydrogen, halogen, a hydroxyl group, an alkyl group having 1 to 4 carbon atoms, or an alkenyl group having 2 to 4 carbon atoms, $R_{37}$ and $R_{38}$ are each independently hydrogen, halogen, or an alkyl group having 1 to 4 carbon atoms, and $R_{39}$ is hydrogen or an alkyl group having 1 to 4 carbon atoms.

7. The positive photosensitive resin composition of claim 1, wherein the solvent is selected from the group consisting of gamma butyrolactone (GBL), N-methylpyrrolidone (NMP), propylene glycol methyl ether acetate (PGMEA), ethyl lactate (EL), methyl-3-methoxypropionate (MMP), propylene glycol monomethyl ether (PGME), and mixtures thereof.

8. The positive photosensitive resin composition of claim 1, further comprising an additive selected from the group consisting of a thermal crosslinking agent, a thermal acid generator, a UV absorber, and a mixture thereof.

9. The positive photosensitive resin composition of claim 8, wherein the thermal crosslinking agent comprises a functional group represented by Formula 5:

[Formula 5]

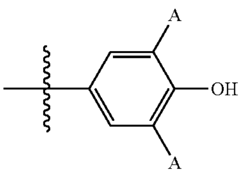

wherein A is Formula a, wherein n is an integer in a range of 1 to 6, and Ra is an alkyl having 1 to 3 carbon atoms:

[Formula a]

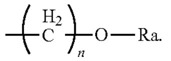

10. The positive photosensitive resin composition of claim 8, wherein the thermal crosslinking agent is selected from the group consisting of compounds represented by Formulas 5-1 to 5-4:

[Formula 5-1]

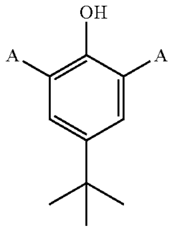

[Formula 5-2]

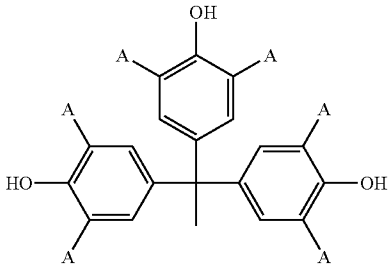

[Formula 5-3]

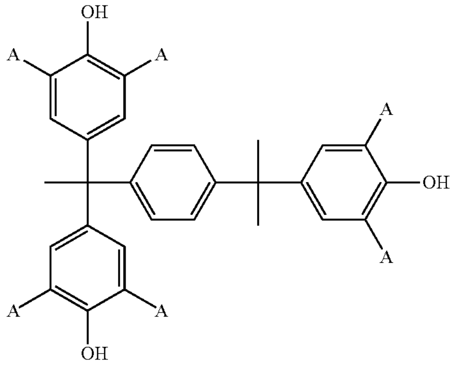

[Formula 5-4]

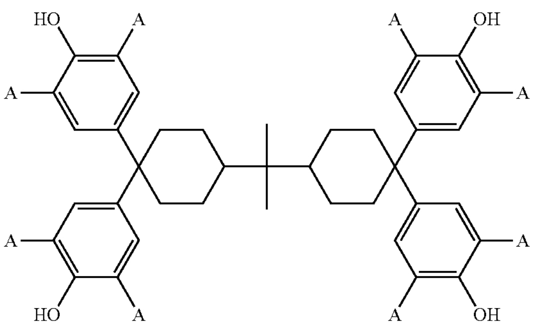

wherein A is Formula a, wherein n is an integer in a range of 1 to 6, and Ra is an alkyl having 1 to 3 carbon atoms:

[Formula a]

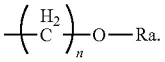

11. The positive photosensitive resin composition of claim 8, wherein the thermal crosslinking agent is contained in an amount of 10 to 50 parts by weight per 100 parts by weight of the polymer resin.

12. A display device comprising a driving circuit, a planarization layer, a first electrode, an insulating layer, a light emitting layer, and a second electrode that are formed on a substrate, wherein either one or both of the planarization layer and the insulating layer are made from the positive photosensitive resin composition of claim 1.

* * * * *